(12) United States Patent
Mahler et al.

(10) Patent No.: US 8,912,450 B2
(45) Date of Patent: Dec. 16, 2014

(54) METHOD FOR ATTACHING A METAL SURFACE TO A CARRIER, A METHOD FOR ATTACHING A CHIP TO A CHIP CARRIER, A CHIP-PACKAGING MODULE AND A PACKAGING MODULE

(75) Inventors: Joachim Mahler, Regensburg (DE); Manfred Mengel, Bad Abbach (DE); Khalil Hosseini, Weihmichl (DE); Franz-Peter Kalz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 128 days.

(21) Appl. No.: 13/169,219

(22) Filed: Jun. 27, 2011

(65) Prior Publication Data
US 2012/0327614 A1 Dec. 27, 2012

(51) Int. Cl.
H05K 1/02 (2006.01)
H01L 23/00 (2006.01)
H05K 1/03 (2006.01)
H05K 1/09 (2006.01)
H05K 1/16 (2006.01)
H05K 1/11 (2006.01)
H05K 1/00 (2006.01)
H05K 1/18 (2006.01)
H05K 7/00 (2006.01)

(52) U.S. Cl.
CPC ......... *H01L 24/29* (2013.01); *H01L 2224/2919* (2013.01); *H01L 2224/83193* (2013.01); *H01L 24/32* (2013.01); *H01L 24/83* (2013.01); *H01L 2224/32225* (2013.01)
USPC ........... 174/259; 174/256; 174/257; 174/260; 174/261; 361/750; 361/751; 361/764; 361/783

(58) Field of Classification Search
USPC ......... 174/521, 524, 527, 528, 529, 530, 536, 174/537, 540, 256, 257, 259, 260, 261, 174/255; 361/750, 751, 760, 761, 762, 764, 361/765, 768, 783, 767, 771; 257/787–795
See application file for complete search history.

(56) References Cited

U.S. PATENT DOCUMENTS

| 3,436,468 | A | * | 4/1969 | Haberecht | ...................... 174/256 |
| 4,232,086 | A | | 11/1980 | Mori et al. | |
| 2008/0265440 | A1 | | 10/2008 | Mahler | |
| 2009/0280314 | A1 | * | 11/2009 | Mahler et al. | .............. 428/310.5 |
| 2010/0052189 | A1 | * | 3/2010 | Sakurai et al. | ................. 257/778 |

(Continued)

FOREIGN PATENT DOCUMENTS

CN 101542705 A 9/2009
CN 102097396 A 6/2011

(Continued)

OTHER PUBLICATIONS

German Office Action of DE 10 2012 105 599.8 dated Jan. 23, 2014.

(Continued)

*Primary Examiner* — Hoa C Nguyen
*Assistant Examiner* — Binh Tran (57) ABSTRACT

A method for attaching a metal surface to a carrier is provided, the method including: forming a first polymer layer over the metal surface; forming a second polymer layer over a surface of the carrier; and bringing the first polymer layer into physical contact with the second polymer layer such that at least one of an interpenetrating polymer structure and an inter-diffusing polymer structure is formed between the first polymer layer and the second polymer layer.

6 Claims, 8 Drawing Sheets

(56) References Cited

U.S. PATENT DOCUMENTS

| | | |
|---|---|---|
| 2010/0175914 A1 | 7/2010 | Pramanik et al. |
| 2011/0026232 A1* | 2/2011 | Lin et al. ................. 361/760 |
| 2011/0079908 A1 | 4/2011 | Lau et al. |
| 2011/0083883 A1* | 4/2011 | Yugawa ................... 174/256 |

FOREIGN PATENT DOCUMENTS

| | | |
|---|---|---|
| DE | 102004032605 B4 | 12/2007 |
| EP | 0173379 A1 | 3/1986 |
| WO | 2004022314 A1 | 3/2004 |

OTHER PUBLICATIONS

Office Action received for Chinese Patent Application No. 201210216348.5 dated Jun. 27, 2014 (for information purposes only), 8 pages.

* cited by examiner

METHOD FOR ATTACHING A METAL SURFACE TO A CARRIER, A METHOD FOR ATTACHING A CHIP TO A CHIP CARRIER, A CHIP-PACKAGING MODULE AND A PACKAGING MODULE

TECHNICAL FIELD

Various embodiments relate generally to a method for attaching a metal surface to a carrier, a method for attaching a chip to a chip carrier, a chip-packaging module, and a packaging module.

BACKGROUND

The present invention relates generally to creating a reliable and stable connection between a chip and a chip carrier and maintaining a stable connection with a chip encapsulation layer. Many different methods for connecting a chip to a chip encapsulation layer are known, however, not many methods are known for connecting a chip to a chip carrier reliably. Up till now, attempts to improve the adhesion of a chip to a chip carrier have been carried out through the modification of the surface of the chip carrier. However, there still exists a problem with creating a stable chip connection particularly when adhesives, e.g. adhesives pastes or glues, are used.

SUMMARY

An embodiment is method for attaching a metal surface to a carrier, the method including: forming a first polymer layer over the metal surface; forming a second polymer layer over a surface of the carrier; and bringing the first polymer layer into physical contact with the second polymer layer such that at least one of an interpenetrating polymer structure and an inter-diffusing polymer structure is formed between the first polymer layer and the second polymer layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

By applying a thin polymer layer over a chip carrier and over a chip back-side, it may be possible to create a stable chip attachment, as well as a stable connection of the encapsulation layer to the chip carrier.

The word "over", used herein to describe forming a layer "over" a side or surface, may be used to mean that the layer may be formed "directly on", e.g. in direct contact with, the implied side or surface. The word "over", used herein to describe forming a layer "over" a side or surface, may be used to mean that the layer may be formed "indirectly on" the implied side or surface with one or more additional layers being arranged between the implied side or surface and the formed layer.

Figure 1:
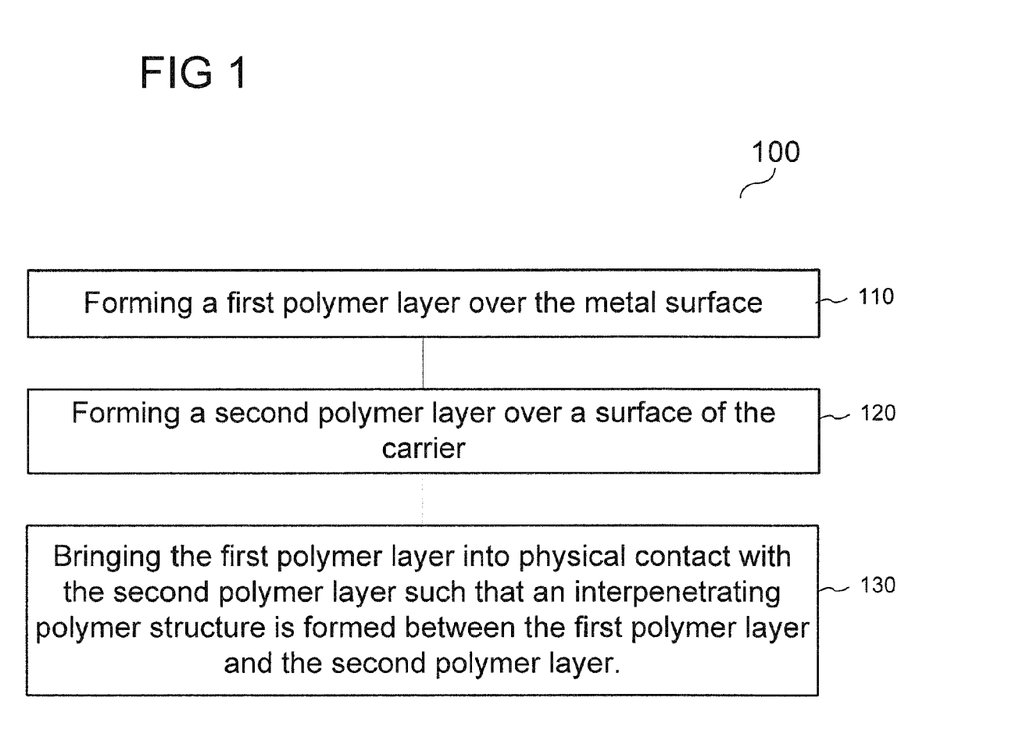
FIG. 1 shows a method for attaching a surface, e.g. a metal surface to a carrier according to an embodiment.

FIG. 1 shows method 100 for attaching a metal surface to a carrier, the method including: forming a first polymer layer over the metal surface (in 110); forming a second polymer layer over a surface of the carrier (in 120); and bringing the first polymer layer into physical contact with the second polymer layer such that at least one of an interpenetrating polymer and an inter-diffusing polymer structure is formed between the first polymer layer and the second polymer layer (in 130).

FIGS. 2A to 2G show method 100 for attaching surface 202, e.g. metal surface 202 to carrier 206 according to various embodiments.

Figure 2A:
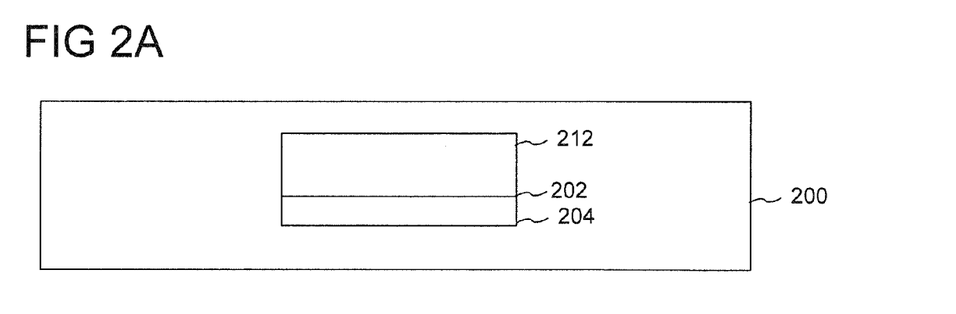
FIGS. 2A to 2G show a method for attaching a surface, e.g. a metal surface to a carrier according to an embodiment.
Figure 2B:
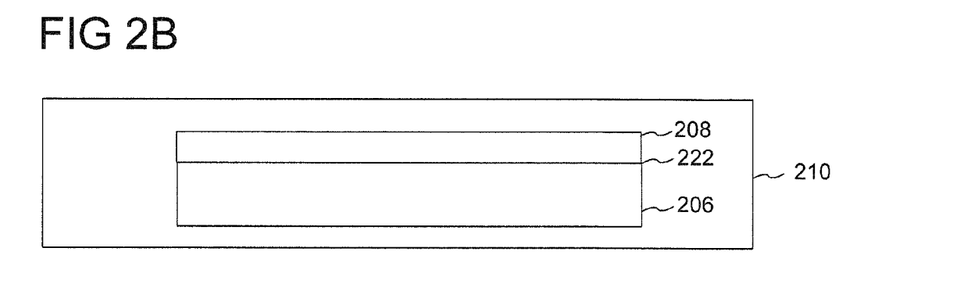

FIG. 2A shows illustration 200, according to method 100, wherein method 100 includes forming first polymer layer 204 over surface 202, e.g. metal surface 202 (as in 110). Surface 202, e.g. metal surface 202, may be a surface of a structure 212, e.g. a chip. FIG. 2B shows illustration 210, according to method 100, wherein method 100 includes forming second polymer layer 208 over surface 222 of carrier 206 (as in 120), First polymer layer 204, and second polymer layer 208 may be respectively formed over their respective surfaces 202, 222, by deposition techniques, e.g. spin-coating, sputtering, chemical vapor deposition. Polymer layer thicknesses of at least 1 µm may be obtained by spin-coating. Polymer layer thicknesses of at least 100 nm and up to 5 µm may be obtained by sputter deposition or chemical vapor deposition CVD.

First polymer layer 204 may have a thickness ranging from about 100 nm to about 100 µm, e.g. from about 500 nm to about 50 µm, e.g. from about 1 µm to about 10 µm. Second polymer layer 208 may have a thickness ranging from about 100 nm to about 100 µm, e.g. from about 500 nm to about 50 µm, e.g. from about 1 µm to about 10 µm. First polymer layer 204 (or second polymer layer 208) may have a thickness smaller than the second polymer layer 208 (or first polymer layer 204). First polymer layer 204 (or second polymer layer 208) may have a thickness less than about 10 µm while second polymer layer 208 (or first polymer layer 204) may have a thickness less than about 100 µm.

Figure 2C:
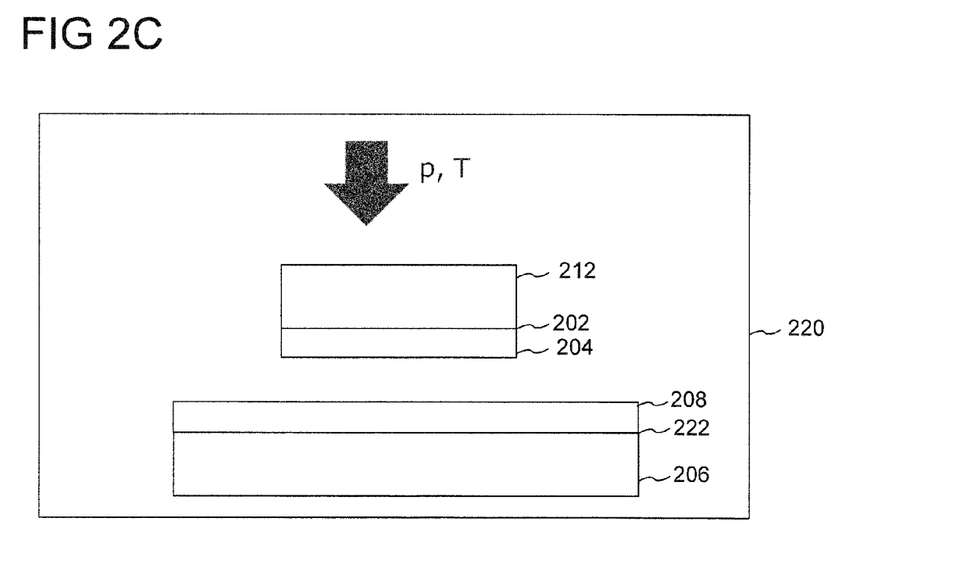

FIG. 2C shows illustration 220 according to method 100, wherein method 100 may include bringing first polymer layer 204 into physical contact with second polymer layer 208. At least one of a pressure process and a temperature process, e.g. heating, may be used to connect surface 202, e.g. metal surface 202, to carrier 206. Through the application of pressure, first polymer layer formed over surface 202 and second polymer layer 208 formed over carrier 206 may be pressed towards each other. First polymer layer 204 and second polymer layer 208 may diffuse into one another, to form a cohesive, stable connection with each other. Pressure values ranging from between about 0.1 N/mm² to about 10 N/mm², e.g. between about 0.5 N/mm² to about 8 N/mm², e.g. between about 1 N/mm² to about 5 N/mm² may be applied to surface 202 and carrier 206. First polymer layer 204 and second polymer layer 208 may be heated to temperatures in the range from about 100° C. to about 250° C., e.g. from about 120° C. to about 230° C., e.g. from about 150° C. to about 200° C.

The stable connection between first polymer layer 204 and second polymer layer 208 relies on forming at least one of an interpenetrating polymer structure and an inter-diffusing polymer structure 214. The maximum processing temperature may be about 400° C. In various embodiments, the maximum processing temperature may be equal or less than 250° C. Thus, a lower processing temperature than temperatures used for conventional adhesion processes, e.g. soldering, may be achieved using method 100. Through at least one of an interpenetrating polymer structure and an inter-diffusing polymer structure 214, polymer-to-polymer connection technology may be used to create a stable connection between surface 202 of structure 212 and surface 222 of carrier 206.

First polymer layer 204 may be chosen and optimized according to the properties of structure 212, e.g. selected from the polymer groups of polyimides, polyimide-precursors, other thermosets like epoxies and acrylates and their precursors, e.g. specific thermoplasts like polyetherketones, polyamideimides, polyetherimides, polysulphones, polyphenylensulfides, polyethersulfones, liquid crystalline polymers and mixtures of those polymers.

Second polymer layer 208, may be chosen and optimized according to the he properties of carrier 206, e.g. selected from the polymer groups of polyimides, polyimide-precursors, other thermosets like epoxies and acrylates and their precursors, e.g. specific thermoplasts like polyetherketones, polyamideimides, polyetherimides, polysulphones, polyphenylensulfides, polyethersulfones, liquid crystalline polymers and mixtures of those polymers.

Figure 2D:
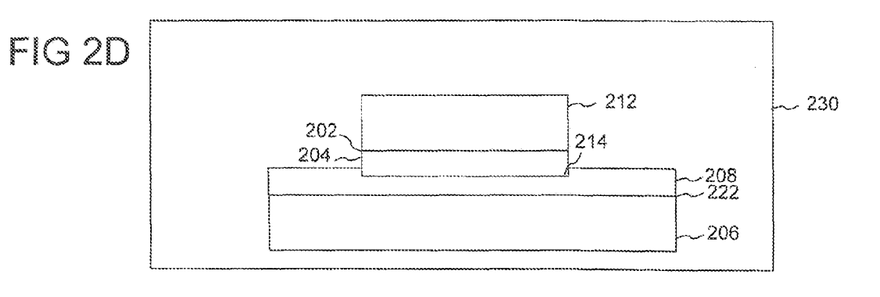

At least one of an interpenetrating polymer and an inter-diffusing polymer structure 214 may be formed between first polymer layer 204 and second polymer layer 208, as shown according to illustration 230 of FIG. 2D. At least one of an interpenetrating polymer and an inter-diffusing polymer structure 214 may include first polymer layer 204 and second polymer layer 208, wherein at least one of an interpenetrating polymer and an inter-diffusing polymer structure 214 may include a physical mixture of material from first polymer layer 204 and second polymer layer 208. At least one of an interpenetrating polymer structure and an inter-diffusing polymer structure 214 may include a physical mixture of molecules of the first polymer layer 204 and second polymer layer 208. At least one of an interpenetrating polymer structure and an inter-diffusing polymer structure 214 may include the non-chemical bonding of molecules of the first polymer layer 204 and second polymer layer 208. At least one of an interpenetrating polymer structure and an inter-diffusing polymer structure 214 may include a physical network of one of first polymer layer 204 and second polymer layer 208 in the other of first polymer layer 204 and second polymer layer 208, At least one of an interpenetrating polymer and an inter-diffusing polymer structure 214 may include a physical entanglement of one of first polymer layer 204 and second polymer layer 208 in the other of first polymer layer 204 and second polymer layer 208 close to the surface region of both polymers, The area of at least one of interpenetration and inter-diffusion, i.e. the thickness of at least one of an inter-penetrating polymer structure and an inter-diffusing polymer structure 214 may lie in the range of about 2 nm to about 500 nm, e.g. 5 nm to about 400 nm, e.g. 10 nm to about 100 nm.

At least one of an interpenetrating polymer structure and an inter-diffusing polymer structure 214 may include first polymer layer 204 and second polymer layer 208. First polymer layer 204 and second polymer layer 208 may each include at least one from the following group of materials: polyimides, polyimide-precursors, other thermosets like epoxies and acrylates and their precursors, e.g. specific thermoplasts like polyetherketones, polyamideimides, polyetherimides, polysulphones, polyphenylensulfides, polyethersulfones, liquid crystalline polymers and mixtures of those polymers. First polymer layer 204 and second polymer layer 208 may be stable up to high temperatures, e.g. up to about 300° C., and may display amorphous characteristics on each of their respective surfaces 202, 222. First polymer layer 204 and second polymer layer 208 may each include the same material. First polymer layer 204 and second polymer layer 208 may be formed from the same material. It may also be possible for first polymer layer 204 and second polymer layer 208 to include different materials, which may be freely chosen.

Figure 2E:
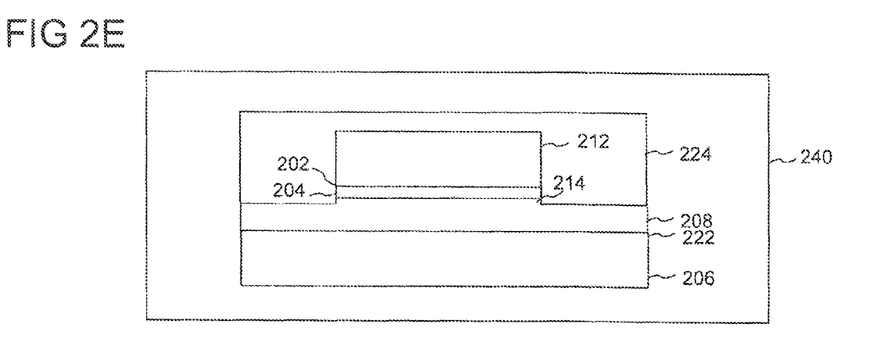

FIG. 2E shows illustration 240, wherein encapsulation layer 224 may be formed at least partially over structure 212, e.g. a chip, and may be formed at least partially over carrier 206. Encapsulation layer 224 may be formed at least partially over second polymer layer 208 and may inter-diffuse with second polymer layer 208 to form a stable connection to carrier 206.

According to an embodiment, at least one of first polymer layer 204 and second polymer layer 208 may include an amorphous material.

According to an embodiment, at least one of first polymer layer 204 and second polymer layer 208 may include a low crystalline material.

According to an embodiment, at least one of first polymer layer 204 and second polymer layer 208 may include a low viscosity material. In various embodiments, a low viscosity material may include a material having a viscosity in the range from about 500 and 0.5 Pa·s, e.g. a viscosity in the range from about 100 and 1 Pa·s, e.g. a viscosity in the range from about 50 and 2 Pa·s. In various embodiments, a low viscosity material may include a material such as e.g. 5 Pa·s.

According to an embodiment, at least one of first polymer layer 204 and second polymer layer 208 may include a high viscosity material. In various embodiments, a high viscosity material may include a material having a viscosity in the range from about 5000 to about 500 Pa·s, e.g. a viscosity in the range from about 2000 to about 1000 Pa·s, e.g. a viscosity in the range from about 1000 to about 500 Pa·s. In various embodiments, a high viscosity material may include a material such as e.g. about 1000 Pa·s, e.g from about 5000 to about 500 Pa·s, e.g. a viscosity in the range from about 2000 to about 1000 Pa·s, e.g. a viscosity in the range from about 1000 to about 500 Pa·s. In various embodiments, a high viscosity material may include a material such as e.g. 500 Pa·s.

Figure 2F:
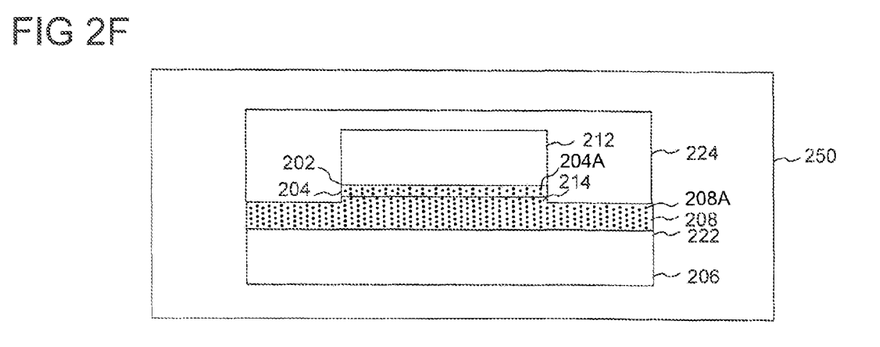

According to an embodiment, at least one of first polymer layer 204 and second polymer layer 208 may include an electrically conducting polymer. At least one of first polymer layer 204 and second polymer layer 208 may include a metal. FIG. 2F shows illustration 250, wherein at least one of first polymer layer 204 and second polymer layer 208 may be densely filled with metal particles 204A and 208A, e.g. silver.

Figure 2G:
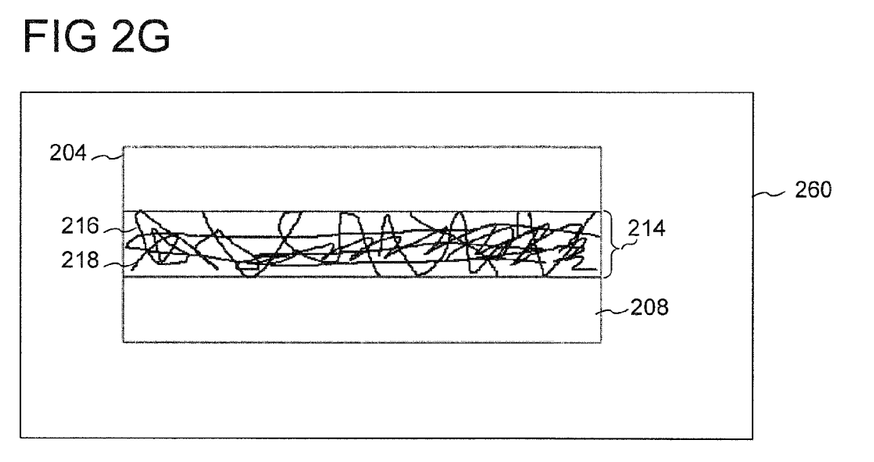

FIG. 2G shows illustration 260, wherein a polymer-to-polymer connection technology may be used to create a stable connection. The polymer-to-polymer connection, e.g. first polymer layer 204 to second polymer layer 208 connection may be applied between structure 212, e.g. a chip, and carrier 206, e.g. a chip carrier. First polymer layer 204 may be applied to surface 202, e.g. metal surface 202, wherein surface 202 may form at least part of a chip back-side. According to an embodiment, first polymer layer 204 may include an organic polymer, e.g. cure epoxy molding compound. Second polymer layer 208 may include a polyimide. At least one of an interpenetrating polymer structure and an inter-diffusing polymer structure 214 may include an entangled interface, having a volume, e.g., a thickness, ranging from about 1 nm to about 50 nm, e.g. from about 10 nm to about 40 nm, e.g. from about 20 nm to about 30 nm. According to an embodiment, first polymer layer 204 (or second polymer layer 208) may be formed from smaller molecules 216 than the molecules 218 forming second polymer layer 208 (or first polymer layer 204). Smaller molecules 216 may include monomer chains 228. Smaller molecules 216 may include oligomer chains 226. Smaller molecules 216 of first polymer layer 204 (or second polymer layer 208) may at least one of interpenetrate and inter-diffuse into second polymer layer 208 (or first polymer layer 204), e.g. smaller molecules 216 of first polymer layer 204 (or second polymer layer 208) may penetrate the gaps between larger molecules 218 of second polymer layer 208 (or first polymer layer 204), thereby mechanically binding first polymer layer 204 and second polymer layer 208. At least one of an interpenetrating polymer structure and an inter-diffusing polymer structure 214 may be formed in an interface region between first polymer layer 204 and second polymer layer 208.

The basic functionalities of the features described with respect to FIGS. 1 and 2 will be referred to and are applicable throughout all the various embodiments which will be described in more detail below. Identical features as to those described in FIGS. 2A to 2G are denoted with the same reference signs.

Figure 3:
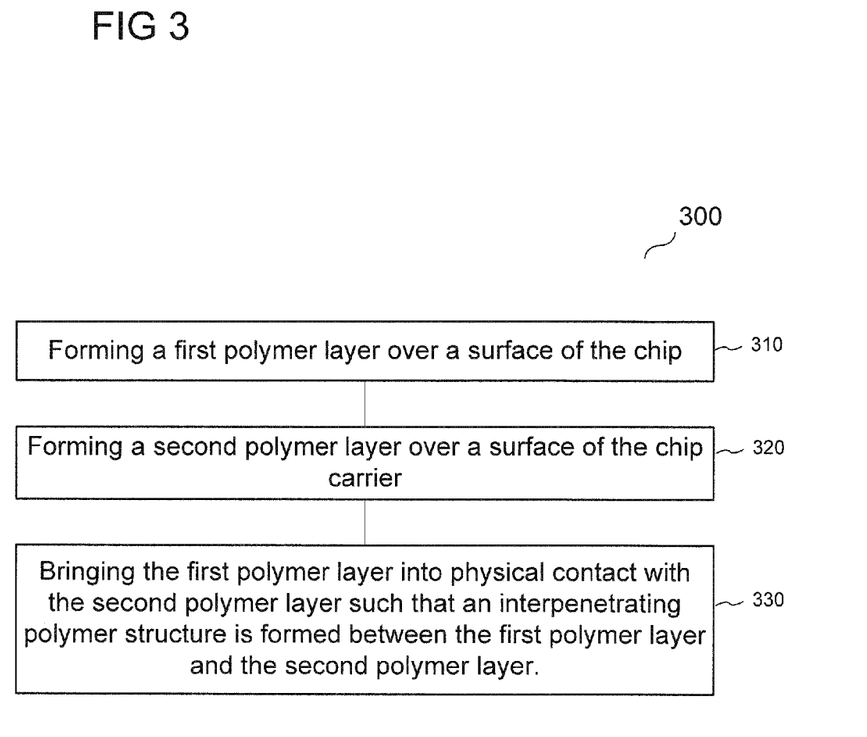
FIG. 3 shows a method for attaching a chip to a chip carrier according to an embodiment.

According to an embodiment, carrier 206 may include a chip carrier 306. Structure 212 may include a chip 312, e.g. a semiconductor chip 312. Chip carrier 306 may include at least one of the following: a printed circuit board, a further chip, a semiconductor wafer, and a leadframe. FIG. 3 describes method 300 for attaching chip 312 to chip carrier 30. Method 300 may include: forming a first polymer layer over a surface of the chip (in 310); forming a second polymer layer over a surface of the chip carrier (in 320); and bringing the first polymer layer into physical contact with the second polymer layer such that at least one of an interpenetrating polymer structure and an inter-diffusing polymer structure is formed between the first polymer layer and the second polymer layer (in 330). The basic functionalities of the features of carrier 206 are applicable to chip carrier 306; the basic functionalities of the features of structure 212 are applicable to semiconductor chip 312. The basic functionalities of chip carrier 306 and chip 312 as well as those of the features described with respect to FIGS. 1 and 2, are applicable to method 300 and throughout all the various embodiments which will be described in more detail below.

Figure 4A:
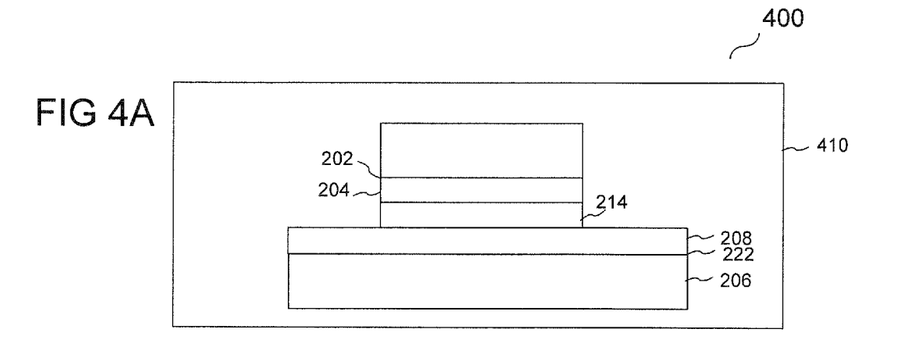
FIGS. 4A to 4B show a packaging module according to an embodiment.
Figure 4B:
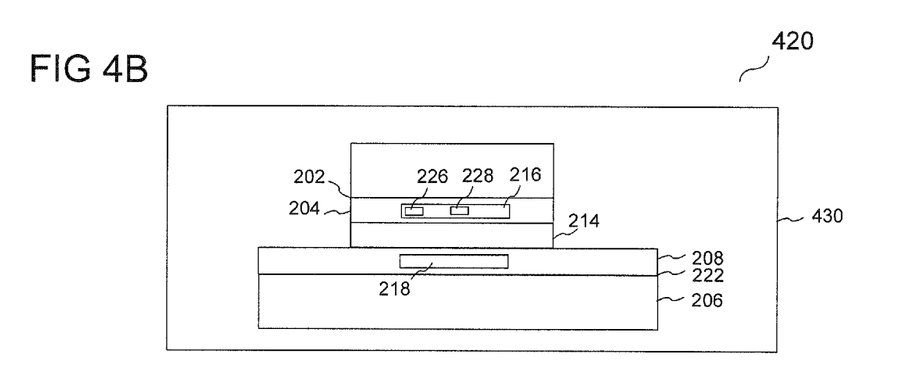

FIG. 4A shows illustration 400 of packaging module 410 including: a metal surface 202 and a carrier 206; a first polymer layer 204 formed over the metal surface 202; a second polymer layer 208 formed over a surface of the carrier 206; and at least one of an interpenetrating polymer structure and an inter-diffusing polymer structure 214 formed between the first polymer layer 204 and the second polymer layer 208. FIG. 4B shows packaging module 430, a further embodiment of packaging module 410, wherein the first 204 (or second 208) polymer layer may be formed from smaller molecules 216 than the molecules 218 forming the second 208 (or first 204) polymer layer. In the case of FIG. 4B, the first polymer layer 204 is shown to be formed from smaller molecules 216 than the molecules 218 forming the second polymer layer 208. The smaller molecules 216 may include a mixture of monomer chains 228 and oligomer chains 226. The smaller molecules 216 may include at least one of monomer chains 228 and oligomer chains 226.

Figure 5A:
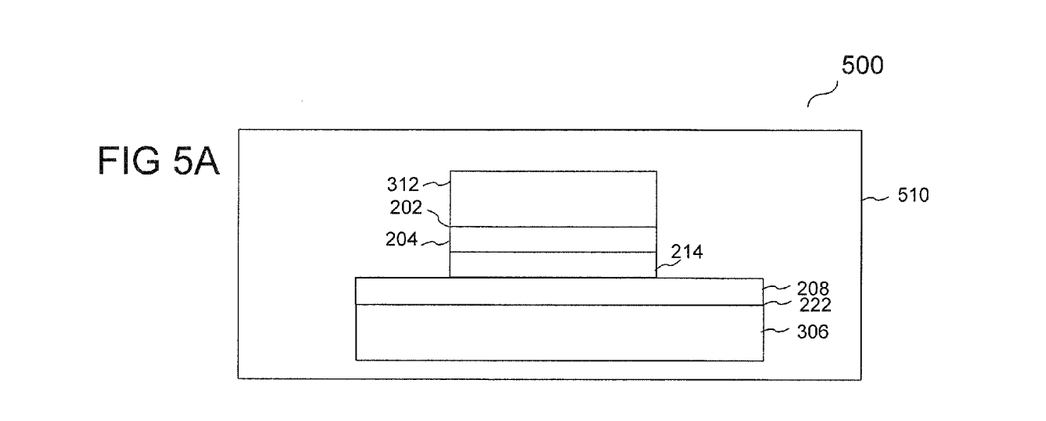
FIGS. 5A to 5B show a chip-packaging module according to an embodiment.
Figure 5B:
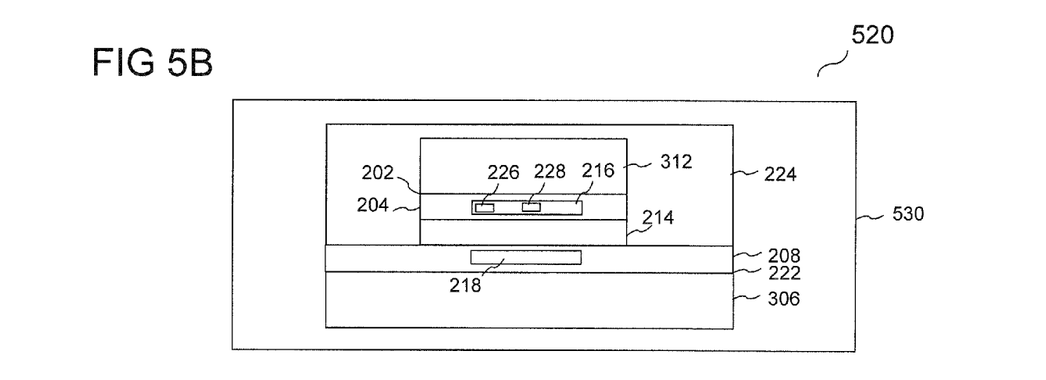

FIG. 5 shows illustration 500 of a chip-packaging module 510 including: a chip 312 and a chip carrier 306; a first polymer layer 204 formed over a surface 202 of the chip 312; a second polymer layer 208 formed over a surface 222 of the chip carrier 306; and at least one of an interpenetrating polymer structure and an inter-diffusing polymer structure 214 formed between the first polymer layer 204 and the second polymer layer 208. FIG. 5B shows chip-packaging module 530, a further embodiment of chip-packaging module 510, wherein the first 204 (or second 208) polymer layer may be formed from smaller molecules 216 than the molecules 218 forming the second 208 (or first 204) polymer layer. In the case of FIG. 5B, the first polymer layer 204 is shown to be formed from smaller molecules 216 than the molecules 218 forming the second polymer layer 208. The smaller molecules 216 may include a mixture of at least one of a monomer chains 228 and oligomer chains 226. According to an embodiment, at least one of an interpenetrating polymer structure and an inter-diffusing polymer structure 214 may include an underbump metallization for chip 312. Chip-packaging module 510 may include a flip-chip packaging module. Chip 312 may include a flip-chip.

Figure 6:
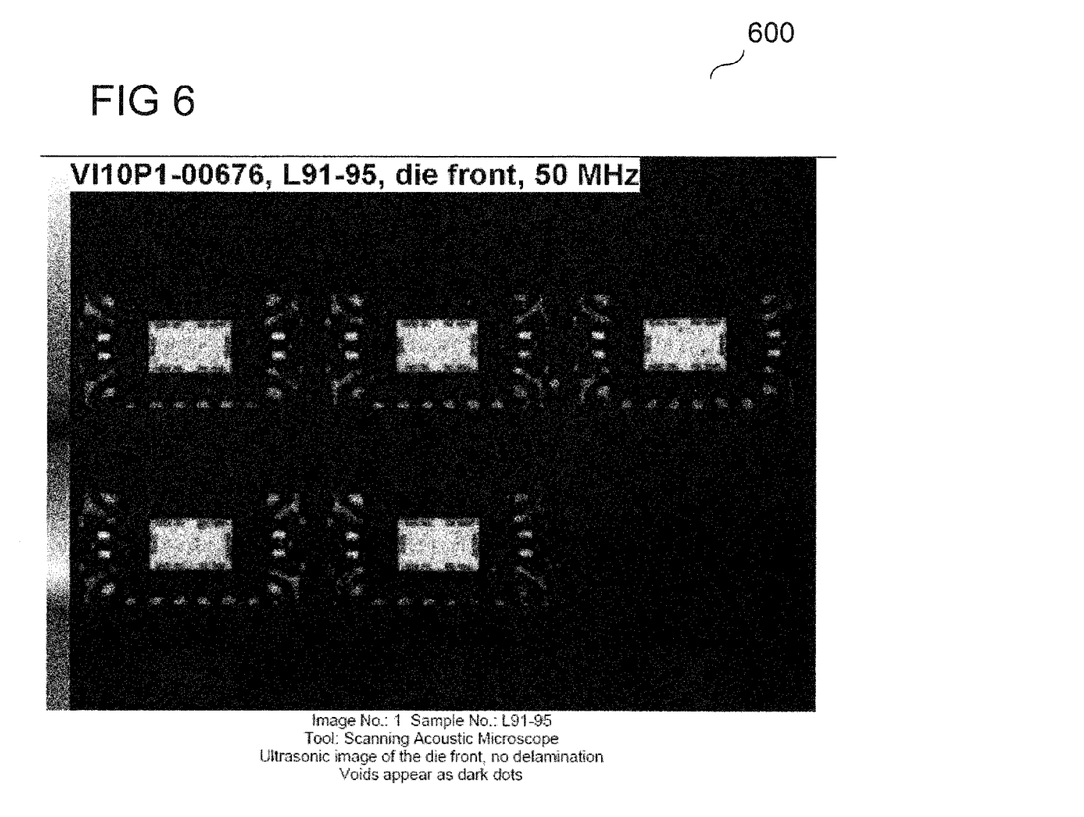
FIG. 6 shows an ultrasonic image of an encapsulation polyimide layer over a chip surface.

FIG. 6 shows illustration 600 of an ultrasonic image of an encapsulation polyimide layer over a chip top surface (die front) taken using a scanning acoustic microscope. Moisture Sensitivity Level (MSL) 1/3×260° C. IR-Reflow & 1000 TC (−65° C./+150° C.). At least one of method 100 and method 300 may be used to create a stable connection, free from delamination, between a chip and chip carrier, and the encapsulation layer and chip carrier. These ultrasonic-images prove the high-performance capability of such interpenetrating networks in terms of adhesion after high stress in semiconductor packages.

A method for attaching a metal surface to a carrier is disclosed, the method including: forming a first polymer layer over the metal surface; forming a second polymer layer over a surface of the carrier; and bringing the first polymer layer into physical contact with the second polymer layer such that at least one of an interpenetrating polymer and inter-diffusing structure is formed between the first polymer layer and the second polymer layer.

According to an embodiment, forming a first polymer layer over the metal surface may include forming a first polymer layer having a thickness ranging from about 100 nm to about 5 µm.

According to an embodiment, forming a second polymer layer over the surface of the carrier includes forming a second polymer layer having a thickness ranging from about 100 nm to about 5 µm.

According to an embodiment, forming a first polymer layer over the metal surface and forming a second polymer layer over a surface of the carrier includes forming a first (or second) polymer layer having a thickness smaller than the second (or first) polymer layer.

According to an embodiment, forming a first polymer layer over the metal surface and forming a second polymer layer over a surface of the carrier includes forming a first (or second) polymer layer from smaller molecules than the molecules forming the second (or first) polymer layer.

According to an embodiment, forming a first (or second) polymer layer from smaller molecules than the molecules forming the second (or first) polymer layer includes forming a first (or second) polymer layer from smaller molecules including at least one of monomer chains and oligomer chains.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure is formed by the smaller molecules of the first (or second) polymer layer interpenetrating the second (or first) polymer layer.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure is formed in an interface region between the first polymer layer and the second polymer layer.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure including the first polymer layer and the second polymer layer is formed between the first polymer layer and the second polymer layer.

According to an embodiment, forming a first polymer layer over the metal surface and forming a second polymer layer over a surface of the carrier includes forming a first and second polymer layer each including at least one from the following group of materials: polyimides, polyimide-precursors, thermosets, epoxies and acrylates and their precursors, thermoplasts, polyetherketones, polyamideimides, polyetherimides, polysulphones, polyphenylensulfides, polyethersulfones, liquid crystalline polymers.

According to an embodiment, forming a first polymer layer over the metal surface and forming a second polymer layer over a surface of the carrier includes forming a first and second polymer layer, wherein at least one of the first polymer layer and second polymer layer includes at least one of an electrically conducting polymer; a metal; an amorphous material; and a low crystalline material.

A method for attaching a chip to a chip carrier is disclosed, the method including: forming a first polymer layer over a surface of the chip; forming a second polymer layer over a surface of the chip carrier; and bringing the first polymer layer into physical contact with the second polymer layer such that at least one of an interpenetrating polymer structure and an inter-diffusing polymer structure is formed between the first polymer layer and the second polymer layer.

According to an embodiment, forming a first polymer layer over the surface of the chip includes forming a first polymer layer over the surface of the chip having a thickness ranging from about 100 nm to about 5 μm.

According to an embodiment, forming a second polymer layer over the surface of the chip carrier includes forming a second polymer layer over the surface of the chip carrier having a thickness ranging from about 100 nm to about 5 μm.

According to an embodiment, forming a first polymer layer over the surface of the chip and forming a second polymer layer over the surface of the chip carrier includes forming a first (or second) polymer layer having a thickness smaller than the second (or first) polymer layer.

According to an embodiment, forming a first polymer layer over the surface of the chip and forming a second polymer layer over the surface of the chip carrier includes forming a first (or second) polymer layer from smaller molecules than the molecules forming the second (or first) polymer layer.

According to an embodiment, forming a first (or second) polymer layer from smaller molecules than the molecules forming the second (or first) polymer layer includes forming a first (or second) polymer layer from smaller molecules including at least one of monomer chains and oligomer chains.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure is formed by the smaller molecules of the first (or second) polymer layer interpenetrating the second (or first) polymer layer.

According to an embodiment, forming a first polymer layer over the metal surface and forming a second polymer layer over a surface of the carrier includes forming a first (or second) polymer layer from smaller molecules than the molecules forming the second (or first) polymer layer, the smaller molecules including at least one of monomer chains and oligomer chains.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure is formed by smaller molecules of the first (or second) polymer layer interpenetrating the second (or first) polymer layer.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure is formed in an interface region between the first polymer layer and the second polymer layer.

According to an embodiment, forming a first polymer layer over the surface of the chip and forming a second polymer layer over the surface of the chip carrier includes forming a first and second polymer layer, at least one of the first and second polymer layer including at least one from the following group of materials: polyimide, duroplast, e.g. polyimides, polyimide-precursors, thermosets, epoxies and acrylates and their precursors, thermoplasts, polyetherketones, polyamideimides, polyetherimides, polysulphones, polyphenylensulfides, polyethersulfones, liquid crystalline polymers.

According to an embodiment, forming a first polymer layer over the surface of the chip and forming a second polymer layer over the surface of the chip carrier includes forming a first and second polymer layer, wherein at least one of the first and second polymer layer includes an electrically conducting polymer.

According to an embodiment, forming a first polymer layer over the surface of the chip and forming a second polymer layer over the surface of the chip carrier includes forming a first and second polymer layer, wherein at least one of the first and second polymer layer includes a metal, e.g. silver.

According to an embodiment, forming a first polymer layer over the surface of the chip and forming a second polymer layer over the surface of the chip carrier includes forming a first and second polymer layer, wherein at least one of the first and second polymer layer includes an amorphous material.

According to an embodiment, forming a first polymer layer over the surface of the chip and forming a second polymer layer over the surface of the chip carrier includes forming a first and second polymer layer, wherein at least one of the first and second polymer layer includes a low crystalline material.

According to an embodiment, bringing the first polymer layer into physical contact with the second polymer layer such that at least one of an interpenetrating polymer structure and an inter-diffusing polymer structure is formed between the first polymer layer and the second polymer layer includes bringing the first polymer layer into physical contact with the second polymer layer such that at least one of an interpenetrating polymer structure and an inter-diffusing polymer structure including the first polymer layer and the second polymer layer is formed between the first polymer layer and the second polymer layer.

According to an embodiment, bringing the first polymer layer into physical contact with the second polymer layer such that at least one of an interpenetrating polymer structure and an inter-diffusing polymer structure is formed between the first polymer layer and the second polymer layer further includes heating the first and second polymer layer in a common process.

According to an embodiment, forming a first polymer layer over the surface of the chip and forming a second polymer layer over the surface of the chip carrier includes forming a first polymer layer over the surface of the chip and forming a second polymer layer over the surface of the chip carrier including a printed circuit board.

According to an embodiment, forming a first polymer layer over the surface of the chip and forming a second polymer layer over the surface of the chip carrier includes forming a first polymer layer over the surface of the chip and forming a second polymer layer over the surface of the chip carrier including a further chip.

According to an embodiment, forming a first polymer layer over the surface of the chip and forming a second polymer layer over the surface of the chip carrier includes forming a first polymer layer over the surface of the chip and forming a second polymer layer over the surface of the chip carrier including a semiconductor wafer.

According to an embodiment, forming a first polymer layer over the surface of the chip and forming a second polymer layer over the surface of the chip carrier includes forming a first polymer layer over the surface of the chip and forming a second polymer layer over the surface of the chip carrier including a leadframe.

A packaging module is disclosed, the packaging module including: a metal surface and a carrier; a first polymer layer formed over the metal surface; a second polymer layer formed over a surface of the carrier; and at least one of an interpenetrating polymer structure and an inter-diffusing polymer structure formed between the first polymer layer and the second polymer layer.

According to an embodiment, the first polymer layer over the surface of the chip has a thickness ranging from about 100 nm to about 5 µm.

According to an embodiment, the second polymer layer over the surface of the chip carrier has a thickness ranging from about 100 nm to about 5 µm.

According to an embodiment, the first (or second) polymer layer has a thickness smaller than the second (or first) polymer layer.

According to an embodiment, the first (or second) polymer layer is formed from smaller molecules than the molecules forming the second (or first) polymer layer.

According to an embodiment, the smaller molecules include at least one of monomer chains and oligomer chains.

According to an embodiment, the interpenetrating polymer structure includes smaller molecules of the first (or second) polymer layer interpenetrating the second (or first) polymer layer.

According to an embodiment, the interpenetrating polymer structure is formed in an interface region between the first polymer layer and the second polymer layer.

According to an embodiment, at least one of the first and second polymer layer includes at least one from the following group of materials: polyimides, polyimide-precursors, thermosets, epoxies and acrylates and their precursors, thermoplasts, polyetherketones, polyamideimides, polyetherimides, polysulphones, polyphenylensulfides, polyethersulfones, liquid crystalline polymers.

According to an embodiment, at least one of the first and second polymer layer includes an electrically conducting polymer.

According to an embodiment, at least one of the first and second polymer layer includes a metal, e.g. silver.

According to an embodiment, at least one of the first and second polymer layer includes an amorphous material.

According to an embodiment, at least one of the first and second polymer layer includes a low crystalline material.

According to an embodiment, the at least one of an interpenetrating polymer structure and an inter-diffusing polymer structure includes the first polymer layer and the second polymer layer.

According to an embodiment, the carrier includes a printed circuit board.

According to an embodiment, the carrier includes a further chip.

According to an embodiment, the carrier includes a semiconductor wafer.

According to an embodiment, the carrier includes a leadframe.

A chip-packaging module is disclosed, the chip-packaging module including: a chip and a chip carrier; a first polymer layer formed over a surface of the chip; a second polymer layer formed over a surface of the chip carrier; and at least one of an interpenetrating polymer structure and an inter-diffusing polymer structure formed between the first polymer layer and the second polymer layer.

According to an embodiment, the first polymer layer over the surface of the chip has a thickness ranging from about 100 nm to about 5 µm.

According to an embodiment, the second polymer layer over the surface of the chip carrier has a thickness ranging from about 100 nm to about 5 µm.

According to an embodiment, the first (or second) polymer layer has a thickness smaller than the second (or first) polymer layer.

According to an embodiment, the first (or second) polymer layer is formed from smaller molecules than the molecules forming the second (or first) polymer layer.

According to an embodiment, the smaller molecules include at least one of monomer chains and oligomer chains.

According to an embodiment, the interpenetrating polymer structure includes smaller molecules of the first (or second) polymer layer interpenetrating the second (or first) polymer layer.

According to an embodiment, the interpenetrating polymer structure is formed in an interface region between the first polymer layer and the second polymer layer.

According to an embodiment, at least one of the first and second polymer layer includes at least one from the following group of materials: polyimides, polyimide-precursors, thermosets, epoxies and acrylates and their precursors, thermoplasts, polyetherketones, polyamideimides, polyetherimides, polysulphones, polyphenylensulfides, polyethersulfones, liquid crystalline polymers.

According to an embodiment, at least one of the first and second polymer layer includes an electrically conducting polymer.

According to an embodiment, at least one of the first and second polymer layer includes a metal, e.g. silver.

According to an embodiment, at least one of the first and second polymer layer includes an amorphous material.

According to an embodiment, at least one of the first and second polymer layer includes a low crystalline material.

According to an embodiment, the at least one of an interpenetrating polymer structure and an inter-diffusing polymer structure includes the first polymer layer and the second polymer layer.

According to an embodiment, the chip carrier includes a printed circuit board.

According to an embodiment, the chip carrier includes a further chip.

According to an embodiment, the chip carrier includes a semiconductor wafer.

According to an embodiment, the chip carrier includes a leadframe.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip-packaging module comprising:
   a chip and a chip carrier;
   a metal surface formed over a surface of the chip;
   a first polymer layer, having a thickness of 20 μm or less, formed over the metal surface;
   a second polymer layer formed over a surface of the chip carrier; and
   at least one of an interpenetrating polymer structure and an inter-diffusing polymer structure formed of the first polymer layer and the second polymer layer.

2. The chip-packaging module according to claim 1, wherein the carrier comprises a printed circuit board.

3. The chip-packaging module according to claim 1, wherein the carrier comprises a further chip.

4. The chip-packaging module according to claim 1, wherein the carrier is a metal based carrier.

5. The chip-packaging module according to claim 1, wherein at least one of the first polymer layer and the second polymer layer is densely infused with metal particles.

6. The chip-packaging module according to claim 1, wherein at least one of the first polymer layer and the second polymer layer is composed of an electrically conductive polymer.

* * * * *